United States Patent
Kim

(10) Patent No.: US 10,750,649 B2
(45) Date of Patent: Aug. 18, 2020

(54) INSPECTION APPARATUS AND COMPONENT MOUNTING SYSTEM HAVING THE SAME

(71) Applicant: KOH YOUNG TECHNOLOGY INC., Seoul (KR)

(72) Inventor: Jeongyeob Kim, Icheon-si (KR)

(73) Assignee: KOH YOUNG TECHNOLOGY INC., Seoul (KR)

(*) Notice: Subject to any disclaimer, the term of this patent is extended or adjusted under 35 U.S.C. 154(b) by 24 days.

(21) Appl. No.: 15/528,361

(22) PCT Filed: Nov. 20, 2015

(86) PCT No.: PCT/KR2015/012558
§ 371 (c)(1),
(2) Date: May 19, 2017

(87) PCT Pub. No.: WO2016/080809
PCT Pub. Date: May 26, 2016

(65) Prior Publication Data
US 2017/0367229 A1    Dec. 21, 2017

(30) Foreign Application Priority Data

Nov. 20, 2014  (KR) .................. 10-2014-0162373
Nov. 20, 2015  (KR) .................. 10-2015-0163159

(51) Int. Cl.
*B23K 3/08*  (2006.01)
*H05K 13/08*  (2006.01)
*B23K 101/42*  (2006.01)

(52) U.S. Cl.
CPC .............. *H05K 13/08* (2013.01); *B23K 3/08* (2013.01); *H05K 13/083* (2018.08); *H05K 13/0817* (2018.08); *B23K 2101/42* (2018.08)

(58) Field of Classification Search
None
See application file for complete search history.

(56) References Cited

U.S. PATENT DOCUMENTS 5,555,316 A * 9/1996 Tsujikawa ............. G06T 7/0006
                                                   348/126
5,991,435 A * 11/1999 Tsujikawa ............. G06T 7/0006
                                                   348/126
(Continued)

FOREIGN PATENT DOCUMENTS

CN       1665385           9/2005
DE   11 2011 104725 T5    10/2013
(Continued)

OTHER PUBLICATIONS

Supplementary European Search Report for European Application No. 15 86 0117, dated Jun. 6, 2018.
(Continued)

*Primary Examiner* — Devang R Patel
(74) *Attorney, Agent, or Firm* — Kile Park Reed & Houtteman PLLC

(57) ABSTRACT

A component mounting system and a method for inspecting mounted components are provided. A component mounting system according to an embodiment, comprises a solder inspection apparatus comparing coordinate information of the solder, which is obtained through measurement of a substrate to which solder is applied, with reference coordinate information to generate coordinate correction data; and a first mounting inspection apparatus comparing a first measurement data obtained by measuring mounting state of a component when the component is mounted based on the coordination correction data through a component mounting apparatus, with the coordinate correction data to verify whether a component is mounted on a position corrected based on the coordinate correction data. In this manner, by (Continued)

adding the verification function for the performance function of the component mounting apparatus to the inspection apparatus, it is possible to monitor the operation state of the component mounting apparatus in each process step.

2 Claims, 3 Drawing Sheets

(56) References Cited

U.S. PATENT DOCUMENTS

| | | | | |
|---|---|---|---|---|
| 8,131,060 | B2* | 3/2012 | Tateyama | H05K 13/0817 |
| | | | | 382/150 |
| 8,191,471 | B2* | 6/2012 | Sato | H05K 3/1233 |
| | | | | 101/123 |
| 8,300,923 | B2 | 10/2012 | Tateyama et al. | |
| 2002/0015780 | A1* | 2/2002 | Holm | B23K 3/0607 |
| | | | | 427/8 |
| 2002/0046462 | A1 | 4/2002 | Inoue et al. | |
| 2002/0083570 | A1 | 7/2002 | Inoue et al. | |
| 2002/0157488 | A1* | 10/2002 | Nagafuku | H05K 13/0465 |
| | | | | 73/866.5 |
| 2005/0209822 | A1* | 9/2005 | Ishiba | H05K 13/0817 |
| | | | | 702/185 |
| 2010/0230472 | A1* | 9/2010 | Okamoto | H05K 3/3436 |
| | | | | 228/104 |

FOREIGN PATENT DOCUMENTS

| | | |
|---|---|---|
| EP | 1 578 186 | 9/2005 |
| JP | 2003-110299 | 4/2003 |
| JP | 2005-252290 | 9/2005 |
| JP | 2006-128253 | 5/2006 |
| JP | 2006-228774 | 8/2006 |
| JP | 2006-319378 | 11/2006 |
| JP | 2007-19139 | 1/2007 |
| JP | 2008-218672 | 9/2008 |
| JP | 2010-251579 | 11/2010 |
| JP | 2013-187483 | 9/2013 |
| JP | 2014-103191 | 6/2014 |
| JP | 2014-103234 | 6/2014 |
| JP | 2017-535965 | 11/2017 |
| WO | 2014/080502 | 5/2014 |

OTHER PUBLICATIONS

International Search Report for International Application No. PCT/KR2015/012558, dated Mar. 15, 2016.

Written Opinion for International Application No. PCT/KR2015/012558 with English translations, dated Mar. 15, 2016.

* cited by examiner

INSPECTION APPARATUS AND COMPONENT MOUNTING SYSTEM HAVING THE SAME

TECHNICAL FIELD

The present invention relates to an inspection apparatus and a component mounting system having the inspection apparatus. More particularly, the present invention relates to an inspection apparatus capable of verifying the reliability of a component mounting process through interlocking of data between inspection apparatuses used during a component mounting process, and a component mounting system having the inspection apparatus.

BACKGROUND ART

In general, a component mounting process for mounting an electronic component on a printed circuit board includes applying a solder on a pad of a printed circuit board (PCB) through a screen printer apparatus, preliminarily mounting the electronic component on the PCB with the solder through a component mounting apparatus using Surface Mount Technology (SMT), and melting the solder through a reflow apparatus to completely mount the electronic component.

The component mounting process may further includes a solder inspection step of inspecting the solder spreading state through a solder inspection apparatus provided at the rear end of the screen printer apparatus, a first mounting inspection process of inspecting mounting state of the electronic component through a first mounting inspection apparatus provided at the rear end of the component mounting apparatus, and a second mounting inspection process of inspecting state of the electronic component after the reflow process through a second mounting inspection apparatus provided at the rear end of the reflow apparatus.

On the other hand, in mounting an electronic component on a PCB with solder spread thereon, a technique for mounting electronic components with reference to coordinate information transmitted from a solder inspection apparatus is applied to the component mounting apparatus.

However, in the present component mounting process, there is no way to precisely verify whether the above function is properly applied in the process. Therefore, there is a need for a precise verification technique for the function of the component mounting apparatus from a process manager.

DETAILED DESCRIPTION OF THE INVENTION

Objects of the Invention

Thus, it is an object of the present invention to provide an inspection apparatus capable of verifying the reliability of a component mounting process through data interlocking between inspection apparatuses used during a component mounting process, and a component mounting system having the inspection apparatus.

Technical Solution

A component mounting system according to an embodiment, comprises a solder inspection apparatus comparing coordinate information of the solder, which is obtained through measurement of a substrate to which solder is applied, with reference coordinate information to generate coordinate correction data; and a first mounting inspection apparatus comparing a first measurement data obtained by measuring mounting state of a component when the component is mounted based on the coordination correction data through a component mounting apparatus, with the coordinate correction data to verify whether a component is mounted on a position corrected based on the coordinate correction data.

The component mounting system may further comprise a second mounting inspection apparatus comparing a second measurement data obtained by measuring mounting state of the component after reflowing process, the coordinate correction data, and the first measurement data to verify coordinate change information of the solder and the component due to the reflow.

A component mounting system according to another embodiment comprises a solder inspection device comparing coordinate information of the solder, which is obtained through measurement of a substrate on which solder is applied, with reference coordinate information to generate coordinate correction data; a front end mounting inspection apparatus inspecting a mounting state of a component to generate a first measurement data; and an integrated management apparatus verifying an operation state of a component mounting apparatus by comparing the coordinate correction data and the first measurement data.

The component mounting system may further comprise a rear end mounting inspection apparatus inspecting a mounting state of the component after reflow process to generate a second measurement data, wherein the integrated management apparatus compares the coordinate correction data, the first measurement data and the second measurement data to verify coordinate change information of the solder and the component due to the reflow process.

An inspection apparatus according to an embodiment comprises a first inspection unit for inspecting whether a component which is mounted is defective through a first measurement data obtained by measuring a mounting state of the component; and a first verification unit comparing a coordinate correction data transmitted from a solder inspection apparatus with the first measurement data to verify whether the component is mounted at a position corrected by the coordinate correction data, wherein the coordinate correction data is a data generated by comparing coordinate information of the solder, which is obtained through measurement of a substrate to which the solder is applied, with a reference coordinate information.

In this case, the coordinate correction data may be an offset value corresponding to a difference between coordinates of the pad and coordinates of the solder. The coordinates of the pad and the coordinates of the solder may be center coordinates of the pad and the solder, respectively.

The first measurement data is an inspection result regarding to the substrate transferred from a component mounting apparatus mounting the component on a position of the solder, based on the coordinate correction data.

An inspection apparatus according to another embodiment comprises a second inspection unit inspecting whether a component after a reflow process is defective through a second measurement data obtained by measuring a mounting state of the component after the reflow process; and a second verification unit comparing a coordination correction data transmitted from a solder inspection apparatus, a first inspection data transmitted from a front end mounting inspection apparatus inspecting a mounting state of the component, and the second measurement data to verify coordinate change information of the solder and the component after reflow process, wherein the coordinate correction data is a data generated by comparing coordination information of the solder, which is obtained by measuring a substrate with the solder spread thereon, with a reference coordinate information.

The coordinate correction data may be an offset value corresponding to a difference between the coordinates of the pad and the coordinates of the solder, and the coordinates of the pad and the coordinates of the solder may be center coordinates of the pad and the solder, respectively.

The first measurement data is an inspection result regarding to the substrate transferred from a component mounting apparatus mounting the component on a position of the solder, based on the coordinate correction data.

An inspection apparatus according to still another embodiment comprises an inspection unit measuring a substrate to which solder is applied, to inspect applying state of solder, and generating a coordinate correction data by comparing coordination information of the solder, which is obtained by measuring with a reference coordination information; and a verification unit verifying operation state of a component mounting apparatus by comparing at least two of a first measurement data transmitted from a front end inspection apparatus inspecting a mounting state of a component, a second measurement data transmitted from a rear end inspection apparatus inspecting a mounting state of the component after a reflow process, and the coordinate correction data.

The coordinate correction data may be an offset value corresponding to a difference between the coordinates of the pad and the coordinates of the solder, and the coordinates of the pad and the coordinates of the solder may be center coordinates of the pad and the solder, respectively.

The first measurement data is an inspection result regarding to the substrate transferred from a component mounting apparatus mounting the component on a position of the solder, based on the coordinate correction data.

The verification unit may compare the coordinate correction data with the first measurement data to verify whether the component is mounted at a position corrected by the coordinate correction data.

The verifying unit may compare at least two of the coordinate correction data, the first measurement data and the second measurement data to verify the coordinate change information of the solder and the component due after the reflow process.

Advantageous Effects

According to such an inspection apparatus and a component mounting system having the inspection apparatus, when the function of mounting the component at the position of the coordinate-corrected solder, based on the coordinate correction data transmitted from the solder testing apparatus, is applied in the component mounting process, the operation of the component mounting apparatus can be monitored, step by step, by adding verifying function to the functions of the first mounting inspection apparatus and the second mounting inspection apparatus, and stable control in entire steps of component mounting process can be possible through analysis of malfunction of the component mounting apparatus.

MODE FOR INVENTION

Figure 1:
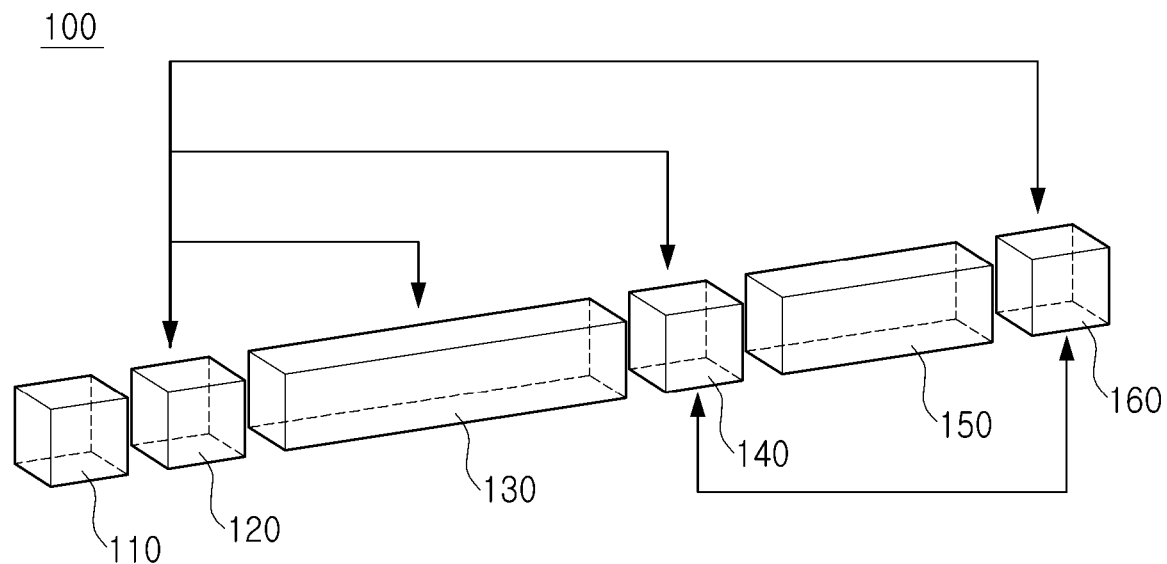
FIG. 1 is a block diagram showing a component mounting system according to an embodiment of the present invention.

The present invention is capable of various modifications and various forms, and specific embodiments are illustrated through the drawings and described in detail in the text. It is to be understood, however, that the invention is not intended to be limited to the particular forms disclosed, but on the contrary, is intended to cover all modifications, equivalents, and alternatives falling within the spirit and scope of the invention.

The terms first, second, etc. may be used to describe various elements, but the elements should not be limited by the terms. The terms are used only for the purpose of distinguishing one component from another. For example, without departing from the scope of the present invention, the first component may be referred to as a second component, and similarly, the second component may also be referred to as a first component.

The terminology used herein is for the purpose of describing particular embodiments only and is not intended to be limiting of the invention. The singular forms "a," "an," and "the" include plural referents unless the context clearly dictates otherwise. In this application, the terms "comprise", "having", and the like are used to specify that a feature, a number, a step, an operation, an element, a component, or a combination thereof, but do not preclude the presence or addition of one or more other features, integers, steps, operations, elements, parts, or combinations thereof.

Unless defined otherwise, all terms used herein, including technical or scientific terms, have the same meaning as commonly understood by one of ordinary skill in the art to which this invention belongs.

Terms such as those defined in commonly used dictionaries are to be interpreted as having a meaning consistent with the meaning in the context of the relevant art and are to be interpreted in an ideal or overly formal sense unless explicitly defined in the present application.

Each block of the accompanying block diagrams and combinations of steps of the flowcharts may be performed by computer program instructions. These computer program instructions may be loaded into a processor of a general purpose computer, a special purpose computer, or other programmable data processing apparatus so that the instructions, which may be executed by a processor of a computer or other programmable data processing apparatus, and means for performing the functions described in each step are created. These computer program instructions may be stored in a computer usable or computer readable memory capable of directing a computer or other programmable data processing apparatus to implement a function in a particular manner. It is also possible for the instructions stored in the block diagram to produce a manufacturing item containing instruction means for performing the functions described in each block or flowchart of each block diagram. Computer program instructions may also be stored on a computer or other programmable data processing apparatus so that a series of operating steps may be performed on a computer or other programmable data processing apparatus to create a computer. It is also possible that the instructions for performing the processing device provide the steps for executing the functions described in each block of the block diagram and at each step of the flowchart.

Further, each block or each step may represent a module, segment, or portion of code that includes one or more executable instructions for executing the specified logical function (s). It should also be noted that in some alternative embodiments, the functions mentioned in the blocks or steps may occur out of order. For example, two blocks or steps shown in succession may in fact be performed substantially concurrently or it is also possible that the blocks or steps are sometimes performed in reverse order according to the corresponding function.

Hereinafter, preferred embodiments of the present invention will be described in detail with reference to the drawings.

FIG. 1 is a block diagram showing a component mounting system according to an embodiment of the present invention.

Referring to FIG. 1, a component mounting system 100 according to an embodiment of the present invention includes a screen printer apparatus 110 for applying solder on a pad of a substrate, a component mounting apparatus 130 for mounting components on the substrate to which the solder is applied, and a reflow apparatus 150 for reflowing substrate on which the components are mounted. The component mounting system 100 further includes a solder inspection apparatus 120 installed between the screen printer apparatus 110 and the component mounting apparatus 130 for inspecting the application state of the solder, a first mounting inspection apparatus (or, a front end mounting inspection apparatus) 140 installed between the component mounting apparatus 130 and the reflow apparatus 150 for inspecting the mounting state of the components, and a second mounting inspection apparatus (or, a rear end mounting inspection apparatus) 160 installed at the rear end of the reflow apparatus 150 for inspecting mounting state of the components after reflowing process.

The screen printer apparatus 110 is an apparatus for applying solder on a pad of a substrate such as a printed circuit board. The screen printer apparatus 110 may apply a solder on a substrate while a stencil mask having an opening corresponding to a position of a pad, is disposed on the substrate, in order to apply solder on the pad.

The solder inspection apparatus 120 inspects the substrate transferred from the screen printer apparatus 110 to check the application state of the solder. For example, the solder inspection apparatus 120 obtains two-dimensional or three-dimensional shape information of the solder applied on the substrate, and then checks whether the solder is over-applied, short-applied or not-applied.

On the other hand, the solder inspection apparatus 120 may generate coordinate correction data to be used in a post-process such as a component mounting process, a first mounting inspection process and a second mounting inspection process to transmits the coordinate correction data to downstream apparatuses installed thereafter, in addition to checking whether there is a defect in the solder applying state, and receive the inspection and verification result information from the downstream apparatuses.

In order to interlock such data, the apparatuses in the component mounting system 100 may be embodied such that data can be transmitted and received between the apparatuses in the component mounting system 100 through wired/wireless network interworking.

Figure 2:
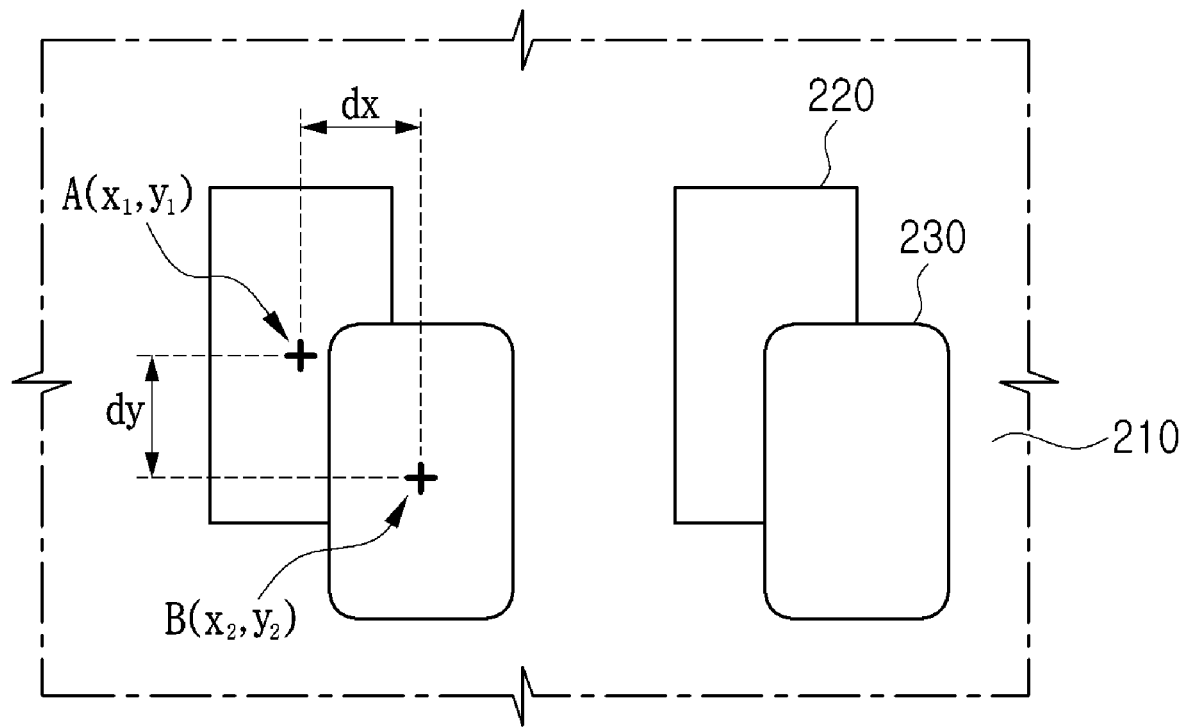
FIG. 2 is a view showing a solder application state according to an embodiment of the present invention.

FIG. 2 is a view showing a solder application state according to an embodiment of the present invention.

Referring to FIGS. 1 and 2, the solder inspection apparatus 120 obtains coordinate information of the solder 230 through measurement of the substrate 210 on which the solder 230 is applied, and generates coordinate correction data by comparing the coordinate information with reference coordinate information. In this case, the reference coordinate information may be set based on at least one of size information, fiducial information, pad information, image information of the substrate to be compared, volume information and height information of the solder, and inspection condition setting information. In addition, the reference coordinate information may be preset or measured.

As an embodiment, the coordinate correction data may be information indicating the degree of misalignment between the pad 220 and the solder 230 and may be an offset value corresponding to a difference between the coordinates A of the pad 220 and the coordinates B of the solder 230. For example, the coordinate correction data may include an X-offset value (dx) corresponding to the difference between the X-coordinate $x_1$ of the pad 220 and the X-coordinate $x_2$ of the solder 230, and a Y-offset value (dy) corresponding to the difference between the Y-coordinate $y_1$ of the solder 230 and the Y-coordinate $y_2$ of the solder 230. In addition, the coordinate correction data may further include rotation information indicating a rotation angle of the solder 230 with respect to the pad 220.

In obtaining coordinates of the pad 220 and the solder 230, the center coordinates of the pads 220 and the solder 230 can be set as coordinate values. Alternatively, the coordinates of the pad 220 and the solder 230 may be set to any one point such as the corner coordinates of the pad 220 and the solder 230 or the intermediate position with respect to any one side. When the pad 220 and the solder 230 are formed as a pair, the center positions of the pair may be set to the coordinates of the pad 220 and the solder 230.

The solder inspection apparatus 120 supplies the coordinate correction data generated in this manner to the component mounting apparatus 130, the first mounting inspection apparatus 140 and the second mounting inspection apparatus 160 connected therewith by a wire or wireless communication method.

The component mounting apparatus 130 is provided at the rear end of the solder testing apparatus 120, and mounts the components on the substrate to which the solder is applied.

Figure 3:
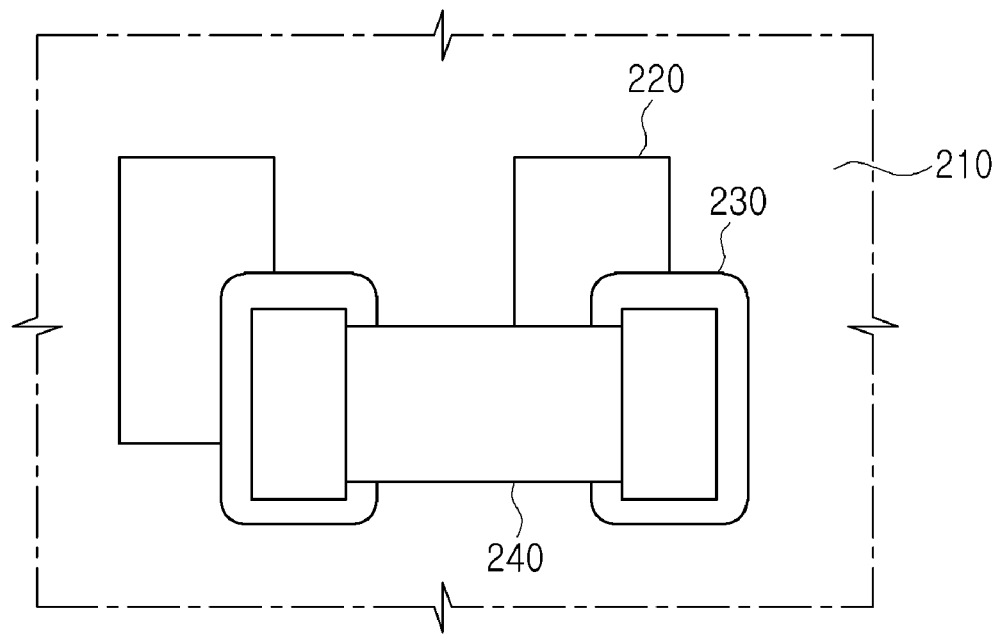
FIG. 3 is a view showing a mounting state of a component mounted through the component mounting apparatus.

FIG. 3 is a view showing a mounting state of a component mounted through the component mounting apparatus.

Referring to FIGS. 1 and 3, in mounting a component 240 onto a substrate 210 to which a solder is applied, the component mounting apparatus 130 mounts the component 240, based on the coordinate correction data from the solder inspection apparatus 120.

In detail, the component mounting apparatus 130 may mounts the component 240 on a corrected coordinate corresponding to the solder 230 position, instead of the pad 220 position, based on the coordinate correction data transmitted from the solder inspection apparatus 120. That is, the component mounting apparatus 130 mounts the component 240 at a position shifted by an amount of dx in the X-direction and an amount of dy in the Y-direction with respect to the original mounting position as shown in FIG. 2.

As described above, when the technique for mounting the component 240 at the position of the solder 230, based on the coordinate correction data transmitted from the solder inspection apparatus 120 is applied in mounting the component 240, the solder 230 is melted and solidified and the solder 230 and the component 240 are returned to the positions of the pads 220, thereby improving the reliability of the component mounting process.

The first mounting inspection apparatus 140 is installed at the rear end of the component mounting apparatus 130 to inspect the mounting state of the components.

Figure 4:
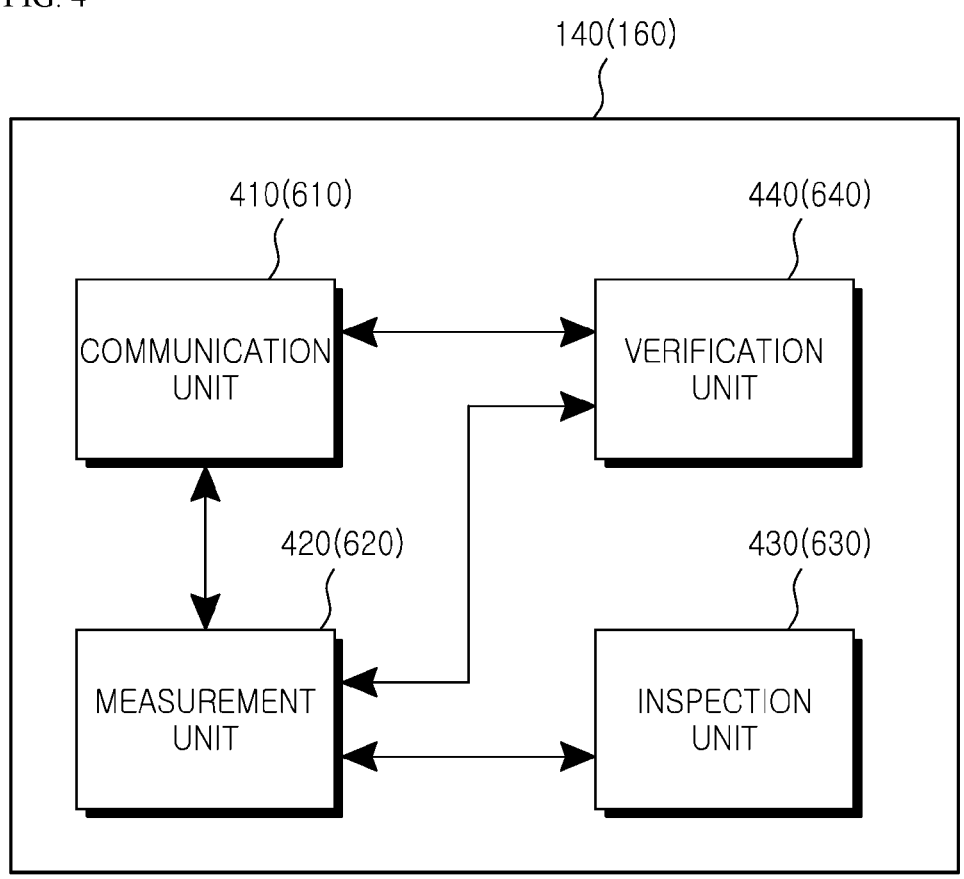
FIG. 4 is a block diagram showing a configuration of a first mounting inspection apparatus according to an embodiment of the present invention.

FIG. 4 is a block diagram showing a configuration of a first mounting inspection apparatus according to an embodiment of the present invention.

Referring to FIGS. 1 and 4, the first mounting inspection apparatus 140 may include a communication unit 410, a measurement unit 420, a first inspection unit 430 and a first verification unit 440.

The communication unit 410 may be connected to the solder inspection apparatus 120 via a wire/wireless communication system, receive information of the coordinate correction data and the measurement data from the solder inspection apparatus 120, and supply a verification data generated by the first verification unit 440 to the solder testing apparatus 120.

The measurement unit 420 includes a lighting device for irradiating light toward a substrate to be measured and a camera for capturing an image of the substrate. The measurement unit 420 measures the mounting state of the components mounted on the substrate by a 2D or 3D method to generate a first measurement data.

The first inspection unit 430 inspects defects of the components such as cold soldering or lifting, on the basis of the first measurement data measured by the first measurement unit 420, which is obtained by measuring the component mounting state.

The first verifying unit 440 verifies whether or not the performance function of the component mounting apparatus 130 is properly applied, separately from the inspection of the first checking unit 430. In order for that, the first verification unit 440 compares the first measurement data generated by the measurement unit 420 with the coordinate correction data transmitted from the solder inspection apparatus 120 to verify whether the component 240 is properly mounted at a corrected position by the coordinate correction data. For example, the first verification unit 440 obtains the coordinate information of the component 240 mounted from the first measurement data, compares the coordinate information of the component 240 with the coordinate correction data, and verifies the offset of the position on which the component 240 is mounted by the component mounting apparatus 130.

In this way, the first mounting inspection apparatus 140 can monitor the operation state of the component mounting apparatus 130 through the verification function of the first verification unit 440.

On the other hand, the first mounting inspection apparatus 140 may supply the first measurement data generated by the measurement unit 420 and the verification data generated by the first verification unit 440 to the solder inspection apparatus 120 and the second mounting inspection 160 through the communication unit 410.

The reflow apparatus 150 is installed at the rear end of the first mounting inspection apparatus 140 and performs a reflow process on the substrate on which the components are mounted.

Figure 5:
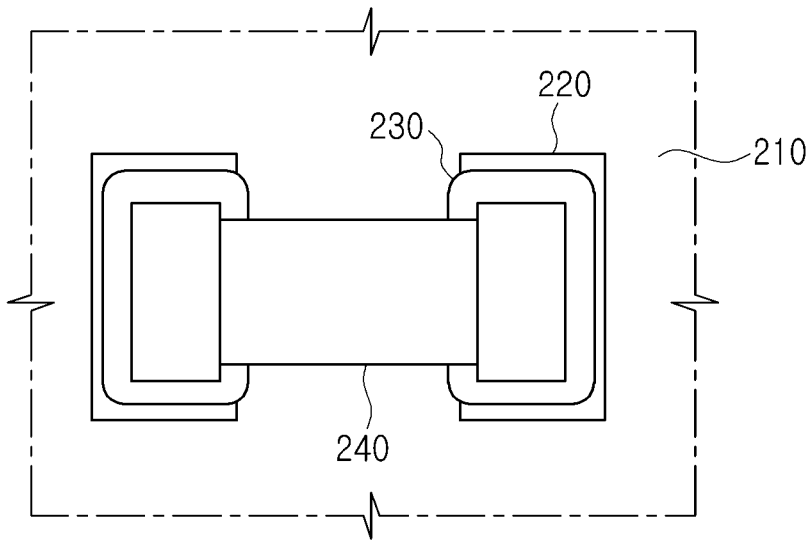
FIG. 5 is a view showing a component mounting state after a reflow process according to an embodiment of the present invention.

FIG. 5 is a view showing a component mounting state after a reflow process according to an embodiment of the present invention.

Referring to FIGS. 1 and 5, the reflow apparatus 150 heats the substrate 210 on which the component 240 is mounted to a predetermined temperature to melt the solder 230. Through this reflow process, the terminals of the component 240 and the solder 230 are fully bonded.

The solder 230 and the component 240 are returned to the position of the pad 220 by the reflow process because the solder 230 melted by the reflow process has a property of spreading along the surface of the pad 220.

The second mounting inspection apparatus 160 is installed at the rear end of the reflow apparatus 150 to check the mounting state of the reflowed component. The second mounting inspection apparatus 160 has substantially the same configuration as that of the first mounting inspection apparatus 140. Therefore, the second mounting inspection apparatus 160 will be explained referring to FIG. 4 disclosing the configuration of the first mounting inspection apparatus 140.

Referring to FIGS. 1, 4 and 5, the second mounting inspection apparatus 160 may include a communication unit 610, a measurement unit 620, a second inspection unit 630, and a second verification unit 640.

The communication unit 610 is connected to the solder inspection apparatus 120 and the first mounting inspecting apparatus 140 through a wire or wireless communication method, receives the coordinate correction data and the measurement data of the substrate on which the solder is applied from the solder inspection apparatus 120, and receives the first measurement data for the component mounting substrate from the first mounting inspection apparatus 140.

The measurement unit 620 measures the mounting state of the reflowed component 240 in a 2D or 3D manner to generate second measurement data.

The second inspection unit 630 inspects defects of the reflowed components 240 such as cold soldering or lifting, on the basis of the second measurement data measured by the measurement unit 620, which is obtained by measuring the component mounting state.

The second verification unit 640 verifies whether the performance function of the component implementation apparatus 130 is properly applied, separately from the inspection of the second inspection unit 630. In order for that, the second verifying unit 640 compares the second measurement data generated by the measuring unit 620, the coordinate correction data transmitted from the solder inspection apparatus 120, and the first measurement data transmitted from the first mounting inspection apparatus 140, to verify a coordinate change information of the solder 230 and the component 240, which is induced by reflowing. For example, the second verifying unit 640 sequentially compares the coordinate correction data, the first measurement data and the second measurement data, to verify how the positions of the solder 230 and the component 240 are changed during the process of component mounting process and the reflow process. On the other hand, the second mounting inspection apparatus 160 may transmit the verification data confirmed by the second verification unit 640 to the solder inspection apparatus 120 and the first mounting inspection apparatus 140 through the communication unit 610.

As described above, the second mounting inspection apparatus 160 can monitor the operation states of the component mounting apparatus 130, the reflow apparatus 150, and the like through the verification function of the second verification unit 640.

On the other hand, when an integrated database (DB) and management apparatus (not shown) are separately installed, the solder inspection apparatus 120, the first mounting inspection apparatus 140 and the second mounting inspection apparatus 160 may transmit the coordinate correction data, the first measurement data and the second measurement data to the integrated DB and the management apparatus. In this case, after receiving the corresponding data from a transmission/reception unit of the integrated DB and the management apparatus (not shown), an analysis unit may compare the coordinate correction data and the first measurement data or compare the coordinate correction data, the first measurement data and the second measurement data so that the verification can be performed. That is, the verification unit may not be included in the solder inspection apparatus 120, the first mounting inspection apparatus 140, and the second mounting inspection apparatus 160. In this case, the integrated DB and the management apparatus (not shown) can be operated as the verification unit to verify the operation of the component mounting apparatus.

Then, the verification result data can be transferred to the solder inspection apparatus 120. Accordingly, the solder inspection apparatus 120 can correct the coordinate correction data according to the current state of the component mounting apparatus 130 and transmit it to the component mounting apparatus 130.

On the other hand, when an integrated database (DB) and management apparatus (not shown) are not installed, the solder inspection apparatus 120 may generate verification result data based on the verification data. That is, the solder inspection apparatus 120 may include a communication unit, a measurement unit, an inspection unit and a verification unit, as in the mounting inspection apparatus shown in FIG. 4.

In this case, the verification unit of the solder inspection apparatus 120 may compare the first measurement data transmitted from the first mounting inspection apparatus 140 with the coordinate correction data to verify whether the mounted component 240 is mounted at the correction position by the coordinate correction data. Further, the verification unit of the solder inspection apparatus 120 may compare the first measurement data transmitted from the first mounting inspection apparatus 140, the second measurement data transmitted from the second mounting inspection apparatus 160, and the coordinate correction data, to verify the coordinate the coordinate change information of the solder 230 and the component 240 after reflow process, and the verification unit of the solder inspection apparatus 120 may correct the coordinate correction data, based on the verified data to transmit it to the component mounting apparatus 130.

Therefore, since the coordinate correction data can be differently recognized and processed for each component mounting apparatus 130, more effective confirmation and verification of the mounting function of the component mounting apparatus 130 can be possible, by correcting the coordinate correction data based on the verification result.

On the other hand, as a result of comparison with the coordinate correction data based on the first measurement data received from the first mounting inspection apparatus 140, the component mounting apparatus 130 may not implement the coordinate correction data.

This may be determined by determining whether the component mounting apparatus 130 has received an ack signal indicating that the coordinate correction data has been received, or determined by determining applicability through analyzing the comparison result data. In this case, the verifying unit can display on the screen whether or not the component mounting apparatus 130 is abnormal.

Figure 6:
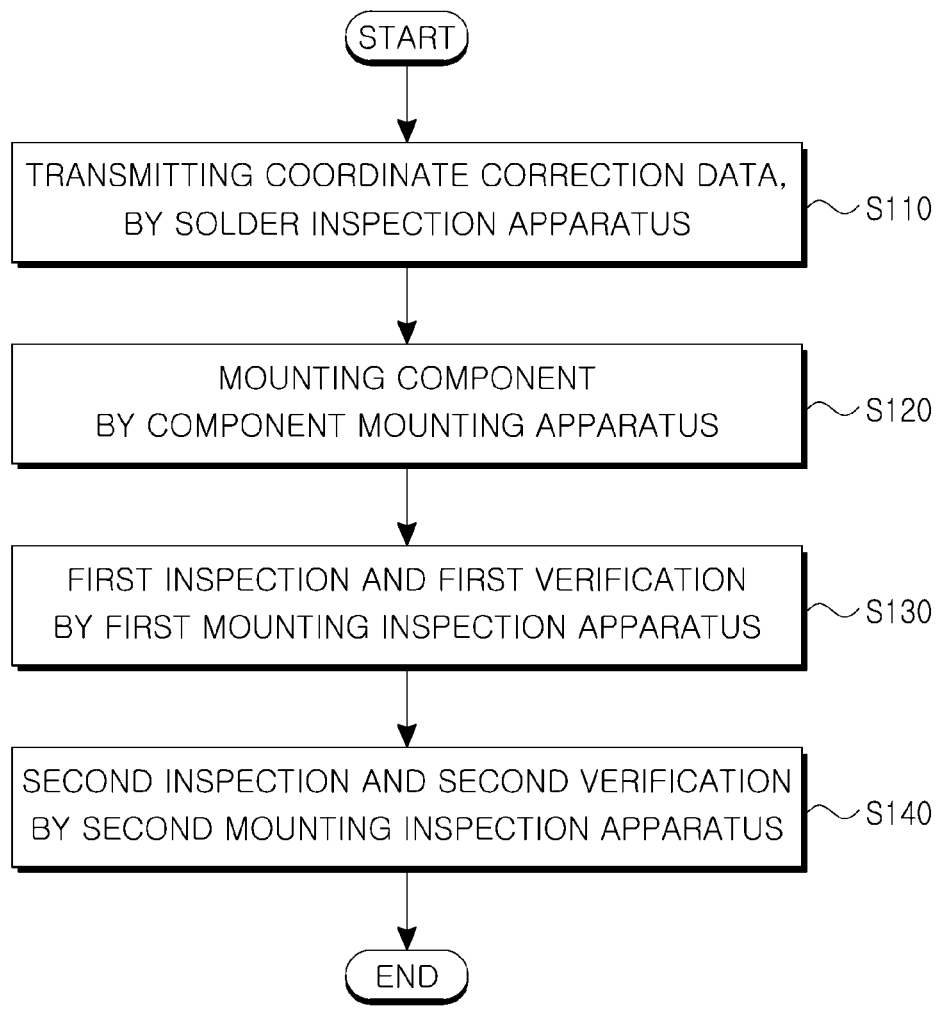
FIG. 6 is a flowchart showing a method of inspecting a mounted component according to an embodiment of the present invention.

FIG. 6 is a flowchart showing a method of inspecting a mounted component according to an embodiment of the present invention.

Referring to FIGS. 1, 2 and 6, solder 230 is first applied onto a pad 220 of a substrate 210 through a screen printer apparatus 110, for the mounting of components.

Next, the substrate 210 on which the solder 230 is applied is measured through the solder inspection apparatus 120 to check whether the solder 230 is in a poor spreading state. Also, the solder inspection apparatus 120 compares coordinate information of the solder 230 obtained through measurement with reference coordinate information to generate coordinate correction data, and supplies the coordinate correction data to the component mounting apparatus 130, the inspection apparatus 140 and the second mounting inspection apparatus 160 (S110).

Next, referring to FIGS. 1, 3, and 6, the component 240 is mounted on the substrate 210 to which the solder 230 is applied through the component mounting apparatus 130 (S120). In this case, the component mounting apparatus 130 mounts the component 240 at the position of the solder 230 based on the coordinate correction data transmitted from the solder testing apparatus 120.

Next, the mounting state of the component 240 is checked through the first mounting inspection apparatus 140, and at the same time, it is verified whether the performance function of the component mounting apparatus 130 is properly applied (S130). For example, the first mounting inspection apparatus 140 inspects cold soldering or lifting of the mounted component 240, based on the first measurement data obtained by measuring mounting state of the component 240. Additionally, aside from inspecting defects of mounting of the component 240, the first mounting inspection apparatus 140 compares the first measurement data with the coordinate correction data transmitted from the solder inspection apparatus 120 to verify whether the mounted component 240 is properly mounted on the position corrected through the coordinate correction data. Also, the first mounting inspection apparatus 140 transmits the first measurement data obtained through measurement to the second mounting inspection apparatus 160.

Next, referring to FIGS. 1, 5, and 6, a reflow process is performed on the substrate 210 on which the component 240 is mounted through the reflow apparatus 150. Through this reflow process, the solder 230 and the component 240 are returned to the position of the pad 220.

Next, the mounting state of the reflowed component 240 is checked through the second mounting inspection apparatus 160, and how the position of the solder 230 and the component 240 is changed through the reflow process is verified through the second mounting inspection apparatus 160 (S140). For example, the second mounting inspection apparatus 160 checks defects of the reflowed component 240 such as cold soldering or lifting, based on the second measurement data obtained by measuring the mounting state of the reflowed component 240. In addition, aside from inspecting defects of mounting of the reflowed component 240, the second mounting inspection apparatus 160 compares the second measurement data, the coordinate correction data transmitted from the solder inspection apparatus 120, and the first measurement data transmitted from the apparatus 140 to verify the coordinate change information of the solder 230 and the component 240 due to the reflow.

As described above, in the component mounting process, when the function of mounting the component at the position of the coordinate-corrected solder, based on the coordinate correction data transmitted from the solder testing apparatus 120, is applied, the operation of the component mounting apparatus 130 can be monitored, step by step, by adding verifying function to the functions of the first mounting inspection apparatus 140 and the second mounting inspection apparatus 160, and stable control in entire steps of component mounting process can be possible through analysis of malfunction of the component mounting apparatus 130.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A component mounting system that monitors a component mounting apparatus, comprising:
   a processor;
   a computer readable memory electrically connected with the processor;
   a solder inspection apparatus electrically connected with the processor and the computer readable memory; and
   a first mounting inspection apparatus electrically connected with the processor and the computer readable memory,
   wherein the solder inspection apparatus:
   measures a substrate to which solder is applied to obtain first coordinate information of the solder,
   compares the first coordinate information of the solder with reference coordinate information to generate second coordinate information,
   corrects the second coordinate information to generate corrected second coordinate information, and
   feeds the corrected second coordinate information to the first mounting inspection apparatus, and
   wherein the first mounting inspection apparatus:
   includes a communication unit, a measurement unit, a first inspection unit, and a first verification unit,
   the measurement unit obtains a first measurement data by measuring a mounting state of a component,
   the first verification unit verifies whether a component is mounted on a corrected position based on the corrected second coordinate information that is fed from the solder inspection apparatus by comparing with the first measurement data, and
   the first verification unit generates a verification result data, and
   wherein the component mounting apparatus:
   modifies the corrected second coordinate information based on the verification result data to generate a third coordinate information, and
   feeds the third coordinate information back to the component mounting apparatus.

2. The component mounting system of claim 1, further comprising:
   a second mounting inspection apparatus; and
   a reflow apparatus,
   wherein the reflow apparatus:
   performs a reflow process on the component,
   generates a second measurement data by measuring a mounting state of the component, and
   feeds the second measurement data to the second mounting inspection apparatus, and
   wherein the second mounting inspection apparatus:
   compares the second measurement data with the corrected second coordinate information and the first measurement data to verify solder and component placement,
   monitors the component mounting apparatus, and
   monitors the reflow apparatus.

* * * * *